United States Patent [19]
Cadwallader et al.

[11] Patent Number: 6,005,386
[45] Date of Patent: Dec. 21, 1999

[54] SUBSTRATE TESTER METHOD AND APPARATUS HAVING ROTATABLE AND INFINITELY ADJUSTABLE LOCATOR JAWS

[75] Inventors: Robert H. Cadwallader, Clinton Corners; Thomas Morrison, Pleasant Valley, both of N.Y.; Klaus Probst, Herrenberg, Germany; Brian J. Wojszynski, Hyde Park; William A. Yager, Salt Point, both of N.Y.

[73] Assignee: International Business Machines Corporation, Armonk, N.Y.

[21] Appl. No.: 08/840,835

[22] Filed: Apr. 17, 1997

[51] Int. Cl.[6] .............................. G01R 1/04; G01R 31/02
[52] U.S. Cl. ........................................ 324/158.1; 324/755
[58] Field of Search ................................ 324/158.1, 755, 324/758, 765; 269/164, 203, 903

[56] References Cited

U.S. PATENT DOCUMENTS 4,436,385  3/1984  Fischer et al. ........................... 350/529
5,329,227  7/1994  Sinclair ................................. 324/158.1

Primary Examiner—Walter E. Snow
Attorney, Agent, or Firm—Steven Capella

[57] ABSTRACT

An apparatus for locating a workpiece on a processing surface includes a first locator arm assembly, a second locator arm assembly, and a pivotal member. The first locator arm assembly includes a first multiple position locator jaw disposed for lateral movement and mating engagement with a first portion of the workpiece. The second locator arm assembly includes a second multiple position locator jaw disposed for lateral movement parallel to the first multiple position locator jaw and further for mating engagement with a second, opposite side, portion of the workpiece. Lastly, the pivotal member is disposed for pivotal movement about a pivot point. The pivotal member is symmetrically coupled between the first locator arm assembly and the second locator arm assembly for inducing an equal but opposite lateral movement in the first and second locator jaws to accurately locate the workpiece on the processing surface between the first and second locator jaws as the locator jaws move towards one another.

13 Claims, 6 Drawing Sheets

SUBSTRATE TESTER METHOD AND APPARATUS HAVING ROTATABLE AND INFINITELY ADJUSTABLE LOCATOR JAWS

CROSS-REFERENCE TO COPENDING APPLICATIONS

Copending U.S. patent applications Ser. No. 08/840,833 filed concurrently herewith, entitled "Locator Actuation Method and Apparatus", (Attorney docket FI9-97-020), describes a method and apparatus for locating and positioning a substrate upon a surface; Ser. No. 08/840,836 filed concurrently herewith, entitled "Substrate Tester Having Shorting Pad Actuator Method and Apparatus", (Attorney docket FI9-97-022) describes a substrate tester; and Ser. No. 08/840,834, filed concurrently herewith, entitled "Substrate Tester Location Clamping, Sensing, and Contacting Method and Apparatus", (Attorney docket FI9-97-023) describes a glass ceramic substrate tester, all assigned to the assignee of the present invention, the disclosures of which are hereby incorporated by reference into the present application.

BACKGROUND OF THE INVENTION

1. Field of the Invention

This invention relates generally to a method and apparatus for locating and positioning a workpiece on a surface and, more particularly, to a locator actuation method and apparatus for locating and positioning a substrate, such as, a multilayer ceramic substrate (MLC), during manufacture and testing thereof.

2. Discussion of the Related Art

Substrate testers are known in the art for performing network integrity tests on substrates, such as multilayer ceramic substrates (MLCs). A substrate refers to a packaging unit that provides an interface between a semiconductor chip (e.g. a very large scale integrated (VLSI) circuit chip) and a higher level packaging unit (e.g., a printed circuit board). A network is generally defined by a set of one or more electrically connected common points on a substrate. Networks are used to distribute electrical signals and voltages externally and/or internally about the substrate in accordance with the requirements of a particular integrated circuit chip. Substrate testers are used during substrate manufacturing to guarantee that there are no process or design created defects (corresponding to opens or shorts) on a particular substrate being tested. Typically, a substrate tester performs a test using a particular contacting scheme. A test matrix scanner is then used to provide an electrical stimulus on each point of the networks contacted by the contacting scheme and then systematically scans the remaining points in the test matrix to guarantee all desired connections exist (opens test) and that there are no unwanted connections (shorts), as the case may be.

In current manufacturing techniques of MLC substrates, there is a need to improve the accuracy and cost structure of substrate locators in an effort to satisfy more stringent manufacturing process requirements. Conventional substrate locators require many moving parts which disadvantageously contribute to tolerance build-ups, inaccuracies, and thus higher manufacturing costs. Conventional substrate locators also use many high precision parts, which are not performance efficient or cost efficient for meeting the current manufacturing requirements. For example, multi-cam drive assemblies are exceedingly costly in terms of their use in the manufacturing process.

Current state of the art substrate locators include a number of moving parts, which may include parts such as precision cam slots, cam followers, gears, etc.. The moving parts contribute to a build up of tolerances. This build up of tolerances prevents a precise and absolute locating and positioning by the locator with respect to a centering of the substrate parts over or under a workstation, wherein the workstation requires extreme positioning accuracy and repeatability. The workstation may also include a high speed substrate tester (HSST) which has traditionally been characteristically large and slow.

Features on MLC substrates are very small and in close proximity to one another. For example, any one particular MLC substrate may include more than one thousand pin or pad connections in an area on the order of one-quarter square inch of space, as can be realized in the current state of art for MLC substrates. It is thus very critical to align the substrate parts in a repeatable manner, for example, with respect to a testing and a placement of test contacts, or other processing and manufacturing options, such as chip placement, discrete wiring, etc.

U.S. Pat. No. 4,436,385, issued Mar. 13, 1984 and entitled "Specimen Holder for Inverted Microscopes" discloses a specimen holder having a wide range of capability for replaceably accepting and holding any one of a variety of sizes and shapes of specimens. In one embodiment, the specimen holder includes a release and clamp mechanism for one-handed operation. A series of interconnected mechanical links are disposed between a first plate and a second plate. The interconnected links pivot with respect to each other at their respective interconnections. Furthermore, one of the interconnected links includes a pin and slot connection to one of the plates, which further pivots about a pivot point for moving the plates towards each other or away from one another via the multiple interconnected links. However, a given amount of movement in one direction by the pin and slot connected linkage does not produce a corresponding same amount of movement of the corresponding connected plate when the pin and slot connected linkage is moved the same given amount in an opposite direction. Accurate determinable positioning is thus not attainable. This is because the specimen holder suffers from an undesirable buildup of tolerances as a result of the multiple interconnected linkages and the slot and pin connection. Non-uniform plate movement further results in a different centerline location for each successive clamped specimen. In addition, not all of the components of the specimen holder are in tension during a clamping operation, thus the specimen being clamped is subject to a non-uniform clamping force and possible mis-positioning.

In addition, in today's MLC substrate manufacturing environment, a wide variety of substrate sizes are manufactured. For testing of the various sized substrates, the substrate tester must undergo a product changeover to accommodate a substrate of a different size from that which it was previously set up for. This has lead to the use of expensive multiple hardware for making a product changeover, further resulting in a lengthy and inefficient changeover process.

It would thus be desirable to provide a locator which can accurately locate and repeatably position MLC substrates with respect to a centerline location during a manufacturing process, and furthermore, reduce the manufacturing costs of producing the same.

It would further be desirable to provide a product tester having capability for handling a wide variety of substrate sizes in a manner which enables product changeover to be economical, relatively quick and efficient.

SUMMARY OF THE INVENTION

It is an object of the present invention to provide a substrate tester having capability for handling a wide variety of substrate sizes in a manner which enables product changeover in the substrate tester to be economical, relatively quick and efficient.

In accordance with the present invention, an apparatus for locating a workpiece on a processing surface includes a first locator arm assembly, a second locator arm assembly, and a pivotal member. The first locator arm assembly includes a first multiple position locator jaw disposed for lateral movement and mating engagement with a first portion of the workpiece. The second locator arm assembly includes a second multiple position locator jaw disposed for lateral movement parallel to the first multiple position locator jaw and further for mating engagement with a second, opposite side, portion of the workpiece. Lastly, the pivotal member is disposed for pivotal movement about a pivot point. The pivotal member is symmetrically coupled between the first locator arm assembly and the second locator arm assembly for inducing an equal but opposite lateral movement in the first and second locator jaws to accurately locate the workpiece on the processing surface between the first and second locator jaws as the locator jaws move towards one another.

In further accordance with the present invention, a method of locating a workpiece, a substrate tester and a method of testing are also disclosed.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
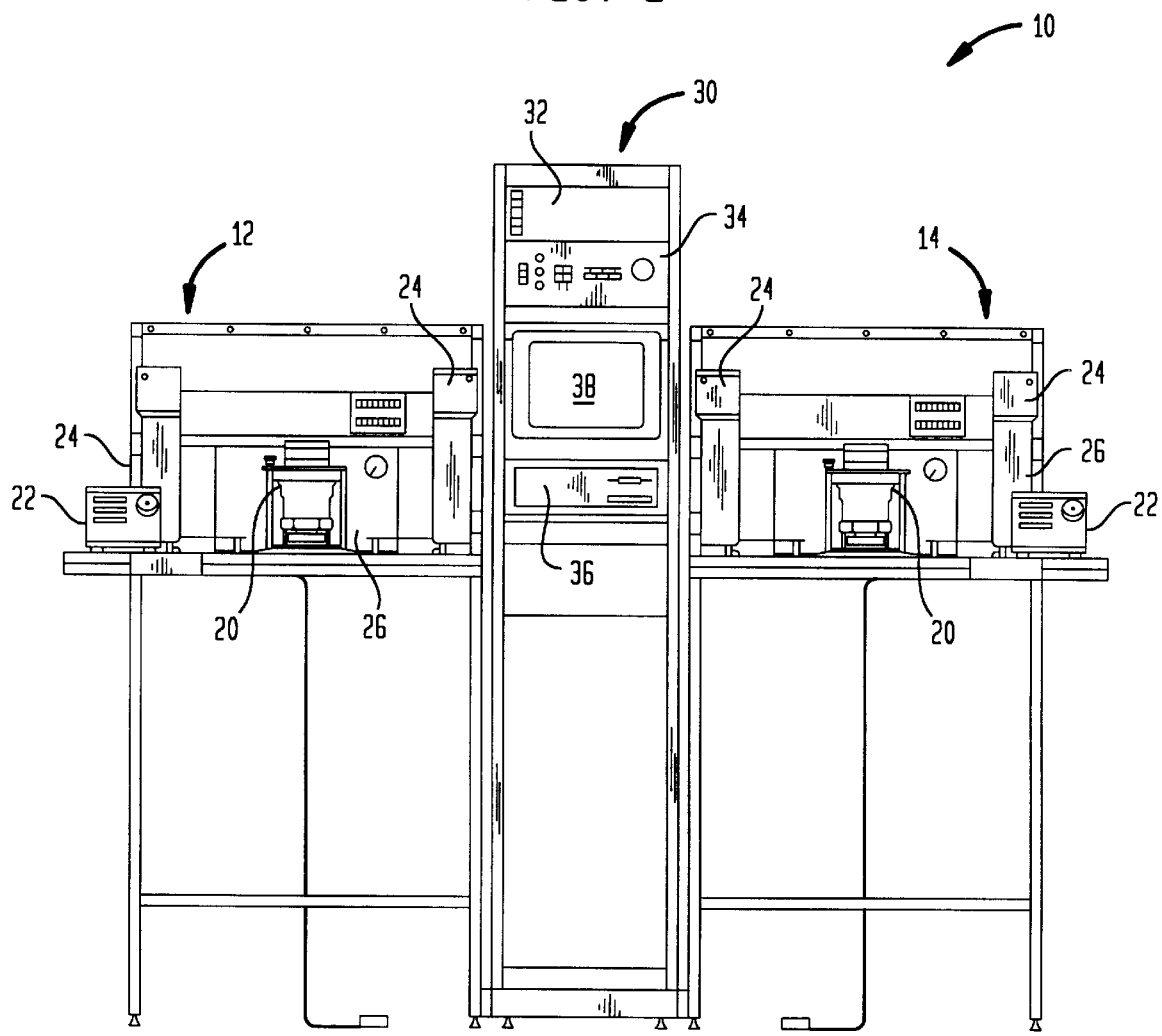
FIG. 1 illustrates a universal substrate tester in accordance with the present invention.

Referring now to FIG. 1, a universal substrate tester 10 is shown which includes first and second test stations 12 and 14, respectively. First and second test stations 12 and 14, are essentially identical test stations which can be individually set up for the testing of the same type of particular substrate or may be set up for the testing of different types of substrates. That is, the product to be tested includes any given substrate having a size dimension and a set of internal/external networks. Each test station of the substrate tester 10 is set up at any given time for the testing of a particular substrate. Furthermore, each test station 12 or 14 can include a mechanical handler 20, an operator panel 22, light curtains 24, and a pneumatic panel 26. The light curtains 24 are included for the purpose of operator safety. When an operator reaches into a designated area of the test station, as defined by the light curtains, pneumatic power is terminated. That is, pneumatic power is removed from the handler when loading and unloading a substrate manually. Furthermore, when an operator reaches into the tester, power to the handler is removed to protect the operator from injury. The pneumatic panel or unit allows air to be brought to the cylinders which drive various mechanisms in and out, as shall be discussed herein below. For purposes simplicity, the discussion to follow shall refer to test station 12, however, the same is equally applicable with respect to test station 14.

A control cabinet 30 is used to house various electronic components of the tester 10. For example, control cabinet 30 contains a test engine 32, a main power supply 34, and a computer 36 with display 38 and keyboard (not shown). Test engine 32 provides an electrical stimulus for application on each point of the substrate networks contacted by a contacting scheme. Test engine 32 further systematically scans remaining points in a test matrix to guarantee all desired connections exist (opens test) and that there are no unwanted connections (shorts), as the case may be, for tester 10. Power supply 34 provides various voltages and signals as may be required for a particular testing operation by tester 10. Control cabinet 30 may also include an appropriate electronic interface panel (not shown).

Referring still to FIG. 1, computer 36 can be programmed for performing desired functions in accordance with the present invention as discussed further herein below. The particular programming of computer 36 can be accomplished using programming and interfacing techniques known in the art, thus the particular programming of computer 36 and associated device interfacing is not discussed in detail herein. In short, computer 36 performs desired computational and control functions of a testing operation of tester 10 in accordance with the present invention. Computer 36 thus receives input signals on respective inputs and provides output signals on corresponding outputs, as may be required for a particular substrate testing operation.

In accordance with the present invention, the substrate tester can accommodate a wide variety of substrate sizes using only one set of adjustable four-point locator jaws. As a result, the need for expensive multiple hardware in effecting a product changeover in the substrate tester is advantageously avoided. Furthermore, a product changeover with the adjustable four-point locator jaws in accordance with the present invention is quick and cost efficient.

Figure 2:
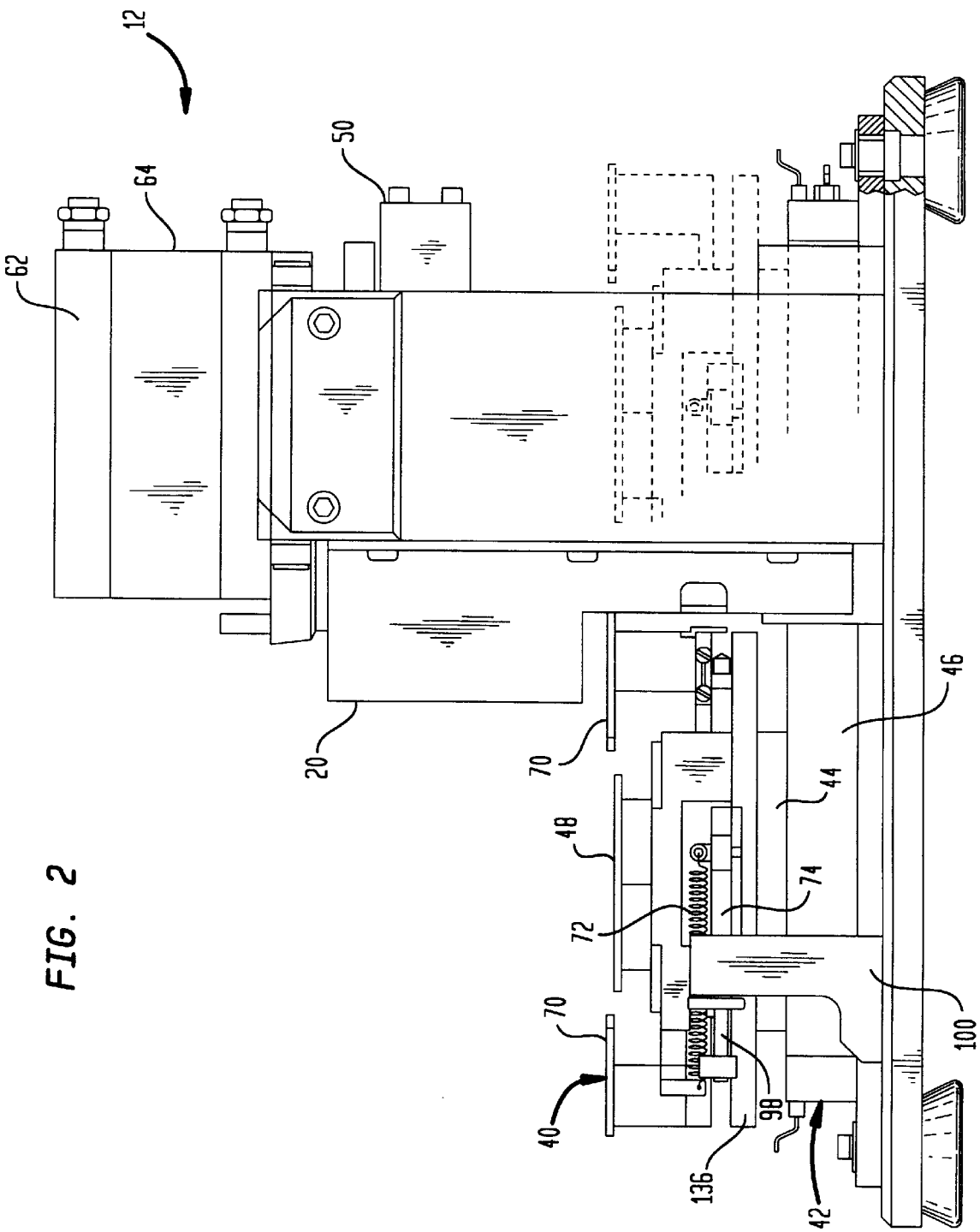
FIG. 2 illustrates a side view of a test station and mechanical handler of the substrate tester according to the present invention.

Turning now to FIG. 2, test station 12 and handler mechanism 20 shall be discussed in further detail. Test station 12 includes a four-point locator mechanism 40 which shall be discussed in further detail with reference to FIGS. 4-7 herein below. The four-point locator mechanism 40 is mounted upon a slide mechanism 42. Slide mechanism 42 includes a precision slide 44 and pneumatic drive unit 46 for moving four-point locator mechanism 40 between a load position (as shown in solid lines of FIG. 2) and a testing position (as shown in phantom lines of FIG. 2) within test station 12. Computer 36 can be used, in part, for controlling precision slide 44 and pneumatic drive unit 46 in a suitable manner for moving four-point locator mechanism 40 between the load position and the testing position in accordance with the particular requirements of a testing operation. A workpiece platen 48 is provided for supporting a workpiece or substrate thereon during a testing operation. Platen 48 thus acts as a support surface.

Figure 3:
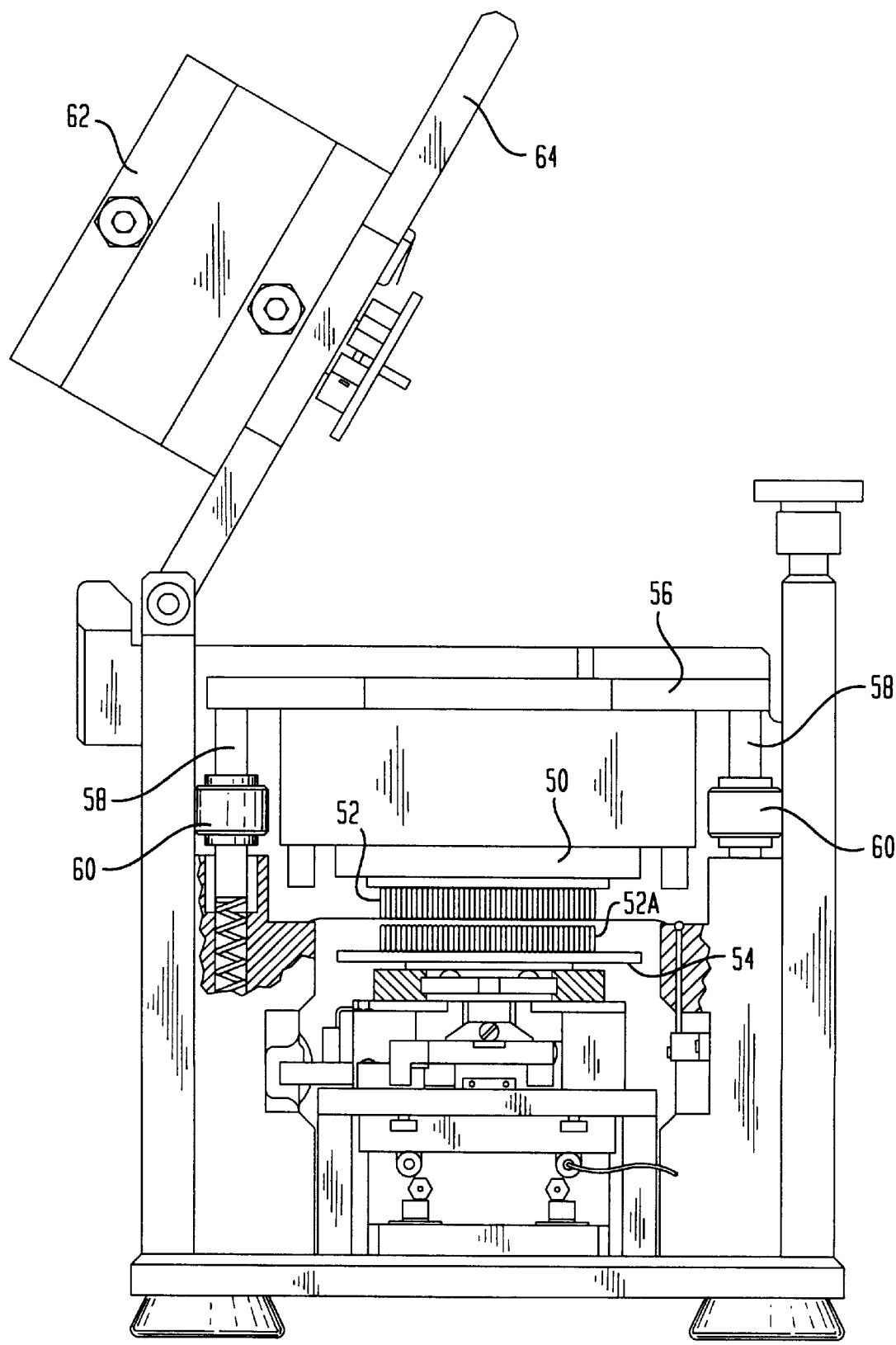
FIG. 3 illustrates a rear view of the test station and mechanical handler of FIG. 2.

Turning now to rear view FIG. 3, some portions thereof being shown in partial cut-away view, other features of test station 12 shall now be briefly described. Test station 12 further includes a substrate top contacting test head or contractor 50. Contactor 50 can include, for example, a buckling beam probe test head assembly. Test head assembly 50 includes test probes 52 for contacting with network test pads (not shown) on a top surface of product substrate 54, as illustrated using phantom lines 52A, as required for a particular substrate testing operation. Buckling beam probe assemblies are known in the art and thus not further discussed herein. Contactor 50 is mounted on a bridge support plate 56 which is enabled for movement up and down on posts 58 and bearings 60. The rear view of FIG. 3 further illustrates product substrate 54 in test station 21 resting upon the workpiece platen 48, wherein workpiece platen 48 can include, for example, a shorting pad platen, such as is described in copending application, Ser. No. 08/xxx,xxx, filed concurrently herewith, entitled "Substrate Tester Having Shorting Pad Actuator Method and Apparatus", (Attorney docket FI9-97-022). An air cylinder 62 is mounted to a lid member 64 of the mechanical handler 20.

Referring once again to FIG. 2, the mechanical handler 20 is shown in the load position with the four point locator mechanism 40 out from under the contactor 50 and air cylinder 62. For a testing operation, a substrate to be tested is first loaded upon platen 48 as follows. In the load position, locator jaws 70 (which are normally held closed by spring 72) are held open by an adjustable stop 74, as will be discussed in further detail herein below. In addition, the locator jaws 70 are held open by a prescribed amount for allowing product substrate 54 to be inserted between the locator jaws 70 and rested upon platen 48, with a desired clearance. When product substrate 54 is in place on platen 48, locator jaw mechanism 40 which is mounted on precision slide 44 is driven toward the right by pneumatic drive unit 46 until it is positioned under the contactor 50 (as shown in phantom lines in FIG. 2). Once the locator jaw mechanism 70 moves away from the adjustable stop 74, the locator jaws are disposed in a closed position for locating and securely clamping substrate 54 with respect to a true center of the workpiece platen 48. Air cylinder 62 is then used to drive contactor 50 downward, wherein contactor probes 52 make contact with the product 54. An electrical testing is then performed in accordance with a particular testing operation for the substrate under test.

Figure 4:
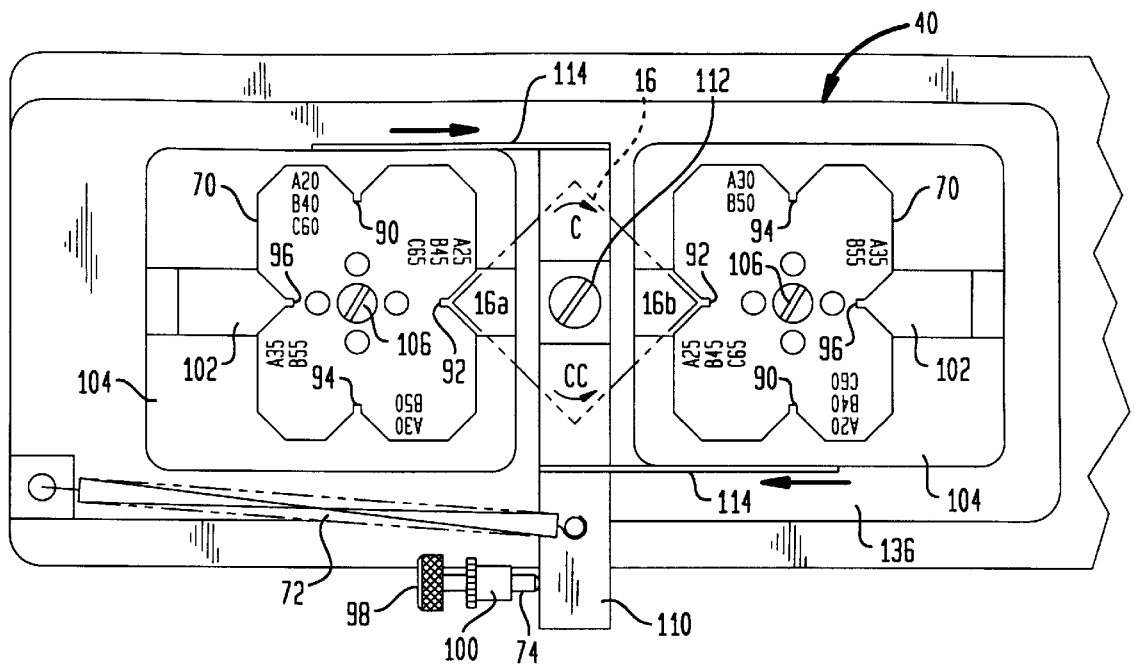
FIG. 4 illustrates a top view of the rotatable and infinitely adjustable locator jaws of the tester in accordance with the present invention.
Figure 5:
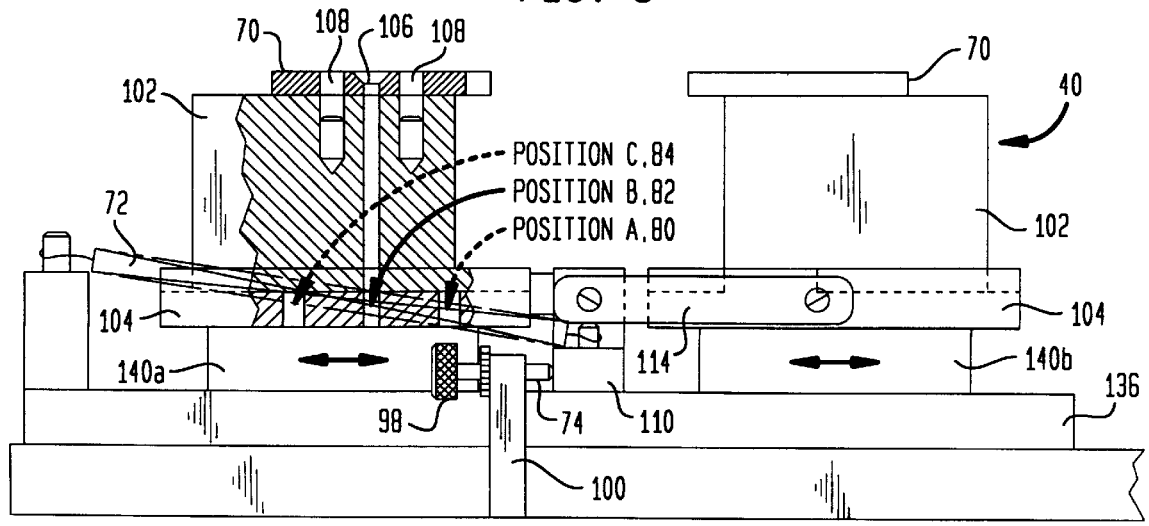
FIG. 5 illustrates a side view of the rotatable and infinitely adjustable locator jaws as shown in FIG. 4, with some portions thereof shown in partial cross-section.
Figure 6:
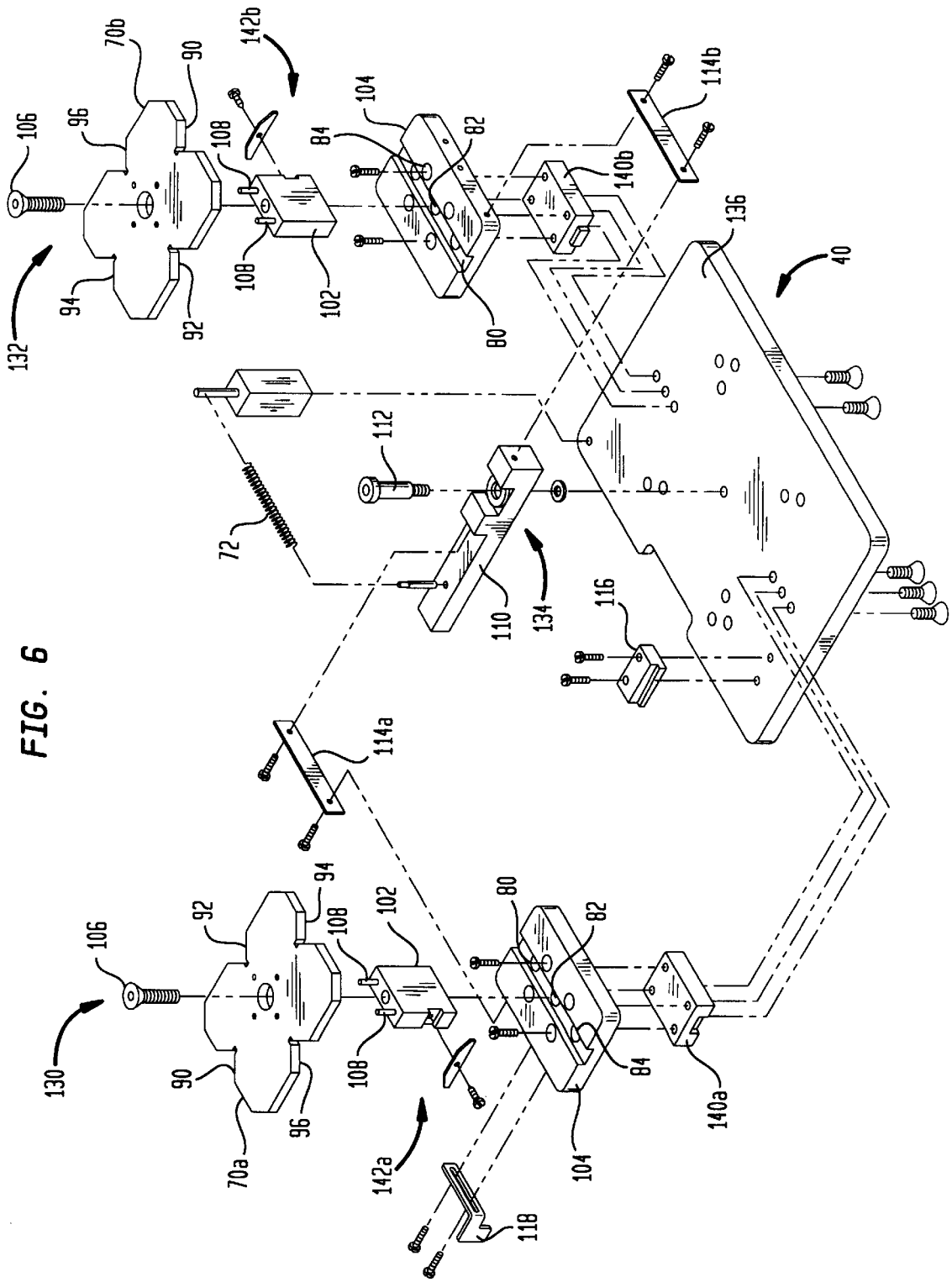
FIG. 6. illustrates an exploded view of the rotatable and infinitely adjustable locator jaws according to the present invention.

Turning now to FIGS. 4–6, the four-point locator mechanism in accordance with the present invention shall be further described. The four-point locator mechanism 40 includes two rotatable and infinitely adjustable locator jaws 70. The locator jaws 70 operate in opposition to hold two diagonally opposite corners of a rectangular substrate 54 in a desired nesting position, further with respect to a true center of the workpiece platen 48. The locator jaws 70 are mounted in a first manner for providing a first level of adjustment, corresponding to a gross adjustment. The locator jaws 70 are further each characterized for providing a second level of adjustment, corresponding to a normal adjustment. A fine granularity level of adjustment is also provided, as shall be discussed further herein below.

The first and most gross level of adjustment is characterized by a screw mount arrangement which is used for positioning each jaw 70 in one of three gross positions 80, 82, and 84 as shown in FIGS. 5 and 6. Each of the three gross positions 80, 82, and 84 can be for example, on the order of approximately 0.5 inches (12.5 mm) apart from one another.

The second level of adjustment provides a "normal" granularity to adjust, for example, among one of four positions 90, 92, 94, and 96 as shown in FIG. 4. The normal granularity adjustment positions 90, 92, 94, and 96 provide an adjustment on the order of approximately 5 mm apart by rotating each locator jaw 70 to select one of the four locator jaw adjustment positions 90, 92, 94, and 96. Each locator jaw can then be rotated to 90, 180, 270, and 360 degrees for implementing a normal adjustment in 5 mm increments.

The fine granularity level of adjustment is provided by adjustable stop 74. Adjustable stop 74 preferably includes a vernier screw 98 mounted upon a vertically disposed support member 100, wherein the vertically disposed support member 100 is stationary and does not move with four-point locator mechanism 40. The fine level of adjustment provides an adjustment on the order of less five millimeters (5 mm), for example. In addition, the fine granularity adjustment is made with respect to an un-loaded condition of the test station 12, corresponding to the locator jaws 70 of four-point locator mechanism 40 being in an open position. The fine granularity adjustment further provides an ability to adjust the locator jaw opening to a desired fine level of clearance for inserting a substrate to be tested.

When the four-point locator mechanism 40 is moved away from the adjustable stop 74 by slide 44 and pneumatic drive unit 46 (i.e., from the loading position to the probing position), a closing of locator jaws 70 occurs. The locator jaws 70 are then disposed in a direction towards each other for locating and clamping substrate 54 in a desired position upon platen 48 (FIG. 2). The locating and clamping force for closing the locator jaws 70 is supplied by the tension of spring 72. Once clamped, spring 72 further provides a necessary spring tension for holding a substage in place once positioned and clamped between locator jaws 70.

Referring now to FIG. 5, each of the four-point locator jaws 70 are positioned upon support posts 102 and support base blocks 104. Each of the base blocks 104 includes three tapped holes, for example, designated as positions "A," "B," and "C" and further identified by numerals 80, 82, and 84, respectively. The three tapped holes of each base block 104 is used for locating a corresponding support post 102 in any one of the three positions. Each support post 102 may be located on the respective base block 104 by using, for example, a single screw 106, respectively. In FIG. 5, the support posts 102 are shown respectively located in position B.

As mentioned above, each locator jaw 70 includes four normal level adjustment positions. That is, each locator jaw 70 can be removed, rotated and repositioned, for example, on dowels 108 to accommodate different substrate sizes. Overall, the combination of the support posts 102 in a gross adjustment position of "A", "B", or "C", in addition to the rotational placement of each locator jaw 70 provides an appropriate sizing for clamping and locating a desired substrate size. The locator jaws 70 can be labeled, as shown, with appropriate indicia for ease of making suitable rotational placement of locator jaws 70 and support posts 102, as appropriate for a changeover from a first substrate size to a different substage size. For example, further as shown in FIG. 5, with the support posts 102 fastened in the "B" position, the locator jaws 70, as shown, are set for a 45 mm product size. This is indicated by the label "B 45" on the locator jaws 70. For a 25 mm product, the support posts 102 would be moved to and fastened in position "A." The same screw 106 that locates and retains a respective post 102 also retains a respective locator jaw 70.

Referring now to FIG. 6, illustrated is an exploded view of the four-point locator mechanism 40, showing the rotatable and infinitely adjustable locator jaws 70 according to the present invention in further detail. In addition to the above discussion, locator mechanism 40 further includes a first locator arm assembly 130, a second locator arm assembly 132, and a pivotal means 134 disposed for pivotal movement about a pivot point 138 and symmetrically coupled, with a zero tolerance buildup, between the first locator arm assembly 130 and the second locator arm assembly 132. First locator arm assembly 130, second locator arm assembly 132, and pivotal means 134 can be mounted upon a base plate 136 is a desired spatial relationship and/or configuration, for example, as shown and discussed further herein below.

First locator arm assembly 130 includes a first linear slide mechanism 140a having a first locator arm 142a slidably mounted thereon for translational movement. The first locator arm 142a includes locator jaw 70a disposed for lateral movement and mating engagement with a first portion 16a of a substrate 16. Second locator arm assembly 132 includes a second linear slide mechanism 140b having a second locator arm 142b slidably mounted thereon for translational movement, the translational movement being parallel to the translational movement of the first locator arm 142a. The second locator arm 142b includes locator jaw 70b which is disposed for lateral movement. Locator jaw 70b is further for mating engagement with a second, opposite side, portion 16b of the substrate 16. Linear slide mechanisms 140a and 140b, preferably include micro frictionless precision linear slides, such as those commercially available by Schneeburger of Bedford, Mass., U.S.A., for example, Model #ND3-105.60. Linear slide mechanisms 140a and 140b are mounted opposite one another, with their respective sliding motion running parallel to each other. Furthermore, slide mechanisms 140a and 140b are mounted to base plate 136 by suitable fasteners.

Referring still to FIG. 6, pivotal means 134 is disposed for pivotal movement on base plate 136 about a pivot point 138. Pivotal means 134 is further symmetrically coupled, with a zero tolerance buildup, between the first locator arm assembly 130 and the second locator arm assembly 132 for inducing an equal but opposite lateral movement in locator jaws 70a and 70b of the first and second locator arm assemblies 130 and 132, respectively. Preferably, pivotal means 134 includes a pivotal arm member 110 symmetrically coupled to the first and second locator arms 142a and 142b using flat springs 114a and 114b, respectively.

Flat springs 114a and 114b are fixedly attached or fastened (i.e., sandwiched solidly) between opposite raised end portions of the pivotal arm member 110 and corresponding first and second locator arm assemblies 130 and 132, respectively, using suitable fasteners. Flat springs 152a and 152b are thus solidly located. Flat springs or shims 152a and 152b are preferably fabricated from flat high carbon spring stock, typically 0.010" thick by 0.50" wide (scaled appropriately for use with the particular precision slide used, such as Schneeburger Model No. ND3-105.60).

Figure 7:
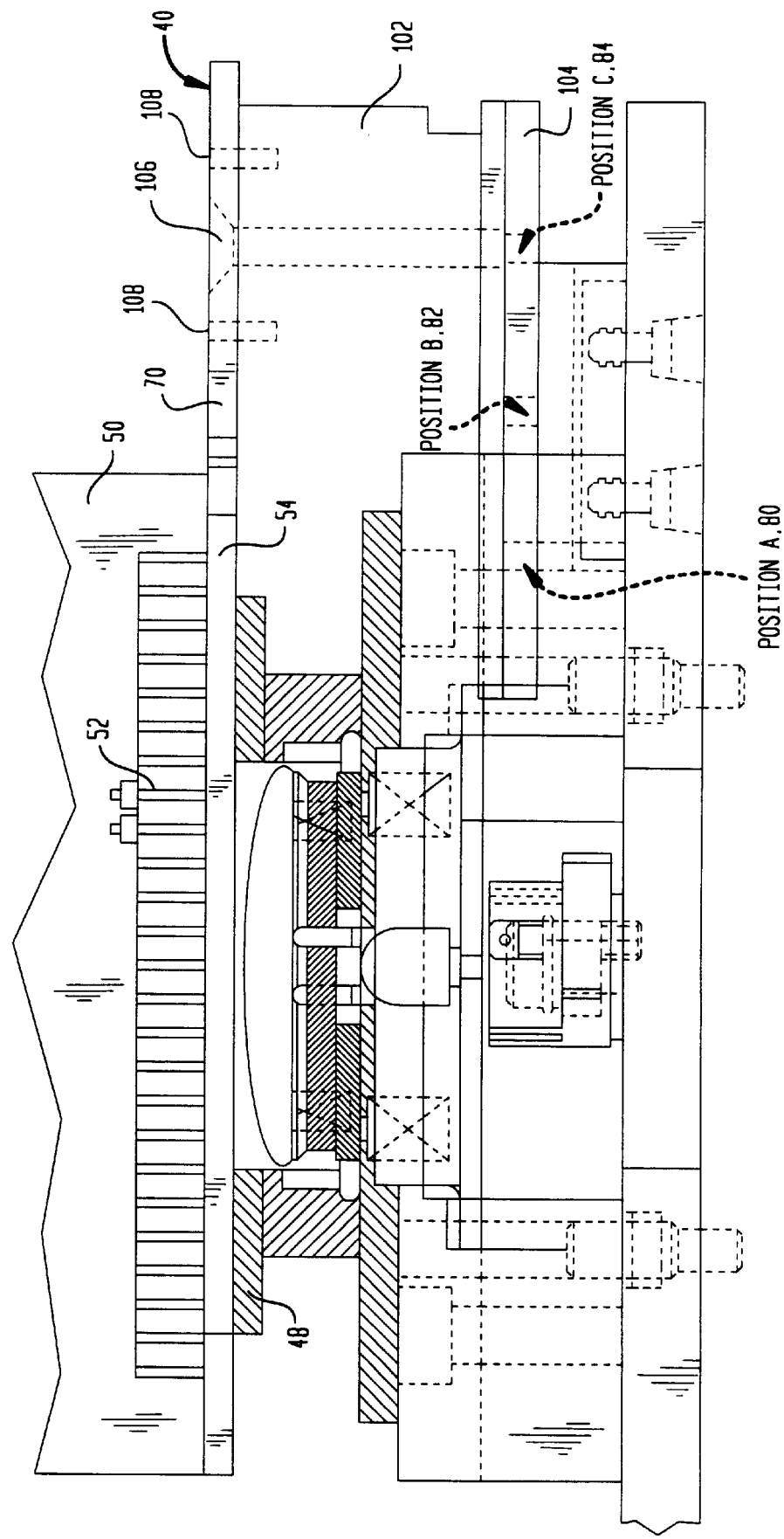
FIG. 7 illustrates a partial cross-sectional side view of one rotatable and infinitely adjustable locator jaw and test head assemblies during a probing of a substrate.

FIG. 7 illustrates a partial cross-sectional side view of one rotatable and infinitely adjustable locator jaw 70 and a test head assembly 50 during a probing of a substrate 54.

Referring once again to FIGS. 4 and 5, a fine adjustment is made using the vernier screw 98. The vernier screw 98 operates pivotal lever 110 to rotate around pivot screw 112. Rotation of pivotal lever 110 draws the locator jaws 70 closer together or further apart by moving respective connecting flat spring links 114. A limit switch 116 can also be provided, the limit switch 116 for sensing whether the locator jaws 70 have contacted the substrate at a required distance or not as actuated by adjustable tab 118 (FIG. 6) on support base block 104. In the case of the locator jaws 70 having not contacted the substrate at a required distance, an error signal can be sent to the computer 36 of the tester 10 for an appropriate corrective action to be taken.

The present invention thus provides a precision locating scheme which utilizes two rotatable/indexable locator jaws 70 to position an infinite variety of substrate sizes.

In accordance with the present invention, an approach of using individual locator jaws which are unique for each product size to be tested is avoided. That is, having different distinct sets of locator jaws for each of different product sizes is undesirable because of costs and inconvenience created when changing between different size substrates. With the present invention, twelve (12) different fixed jaw settings are possible for the handling of at least 12 different product sizes being tested for a manufacturing line. In addition, the present invention provides for a more convenient locator jaw size change, which correspondingly makes it acceptable to have only one set of diagnostic parts sizes (typically a larger size). Diagnostic parts are specially provided parts (not shown) that when run on the tester to assure probes, test matrix, cabling etc. have no defects that will generate erroneous test results. When testing a smaller substrate, jaw locators 70 can now quickly be changed to accept a larger diagnostic part and the diagnostics run with the smaller probe set. The locator jaws 70 are easily rotated back for the smaller sized product and production resumed. Diagnostics must be run each shift of a manufacturing operation and frequently during the shift if problems are suspected. Individual locator jaws which are unique for a product size cost approximately $250 each (i.e., each locator jaw costs $250 and thus a set costs $500). If four different product sizes were to be tested for using individual locator jaws unique to a given product size, then the cost for four unique locator jaw sets would be on the order of $2000 (i.e., 4×$500). In comparison, a rotatable locator jaw of a rotatable locator jaw set costs on the order of approximately $350 (three hundred and fifty dollars), thus a rotatable locator jaw set would be on the order of $700, for handling twelve different substrate sizes, for example, in accordance with the present invention.

Referring to a locator jaw 70 in further detail, the locator jaw 70 includes a nonconductive material such as nylon or durable plastic material, such as DELRIN or VESPEL to provide a non-marring or non-scuffing surface to contact a substrate edge. Each locator jaw 70 is located on an exact centerline of dowel pins 108 in one of four positions. In addition, each locator jaw 70 includes four (4) V-shaped notches opposite and also perpendicular to one another. Each notch is further characterized as an engagement surface including a square or right angle surface, herein referred to as the V-shape surface or notch. In addition, each V-shape engagement surface includes a relief bore at the bottom of the V-shape for receiving a corner of the substrate or workpiece therein during a locating of the substrate to insure side contact. Each notch of a locator jaw 70 is furthermore a different uniform dimension or distance from the dowel pin array. For example, the shortest distance from the first notch is approximately 0.5 inches (12.5 mm). Each notch would gain one-eighth inch (0.125 inches or 3.175 mm) progressively (3 times); thereby, resulting in the four (4) rotational positions that are used to locate four (4) different substrate sizes during normal adjustments. In addition, support base block 104 includes the three positions A, B and C located approximately 0.5 inches (12.5 mm) apart for making of gross adjustments. All combinations of the jaw locator 70 and support base block 104 provide twelve (12) different settings for substrate registration. In addition the vernier jaw adjustment screw 98 can be adjusted to give an infinite adjustment within each setting, for establishing a desired opening of the locator jaws. The present invention thus results in providing a tester having as adjustable range for accepting substrate dimensions, for example, between eighteen and sixty-four millimeters (18 and 64 mm).

The present invention thus provides a locator mechanism adaptable for handling a wide variety of substrate sizes which are manufactured in today's MLC substrate manufacturing environment. The locator mechanism is well suited for use in positioning, locating and clamping of a substrate during testing in a substrate tester, wherein the substrate tester can undergo a product changeover to accommodate a substrate of a different size from that which it was previously set up for with a minimal amount of effort and expense. The present invention is highly efficient and eliminates the use of expensive multiple hardware for making a product changeover. A product tester having a capability for handling a wide variety of substrate sizes in a manner which enables product changeover to be economical, relatively quick and efficient has also been provided by the present invention.

The present invention also provides a locator mechanism which can accurately locate and repeatably position MLC substrates with respect to a centerline location during a manufacturing process, and furthermore, reduce a manufacturing cost of producing the same. Repeatability of the positioning and locating of a substrate using the locator mechanism of the present invention has been shown to have a repeatability on the order of less than one micron (<1 $\mu$m) in locating a product to the center of a testing nest, irregardless of slight size variations of a single type of product being tested.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention, as limited solely by the appended claims.

What is claimed is:

1. An apparatus for locating a workpiece on a processing surface, said apparatus comprising:

first locator arm assembly having a first multiple position locator jaw disposed for lateral movement and mating engagement with a first portion of the workpiece said first locator arm assembly including:
  (i) a first linear slide mechanism, the first multiple position locator jaw adapted for being mounted and positioned between one of at least two locator jaw engagement surface positions on the first linear slide mechanism, wherein each of the locator jaw engagement surface positions is unique to a particular size workpiece being located, and
  (ii) a support base slideably mounted on the first linear slide mechanism, a support post adapted to be mounted and positioned upon the support base in one of at least two gross adjustment positions, wherein the first multiple position locator jaw is further mounted and positioned on the support post in one of the at least two locator jaw engagement surface positions, the at least two locator jaw engagement positions corresponding to normal adjustment positions within a gross adjustment;

second locator arm assembly having a second multiple position locator jaw disposed for lateral movement parallel to the first multiple position locator jaw and further for mating engagement with a second, opposite side, portion of the workpiece, said second locator arm assembly including:
  (i) a second linear slide mechanism, the second multiple position locator jaw adapted for being mounted and positioned between one of at least two locator jaw engagement surface positions on the second linear slide mechanism, wherein each of the locator jaw engagement surface positions is unique to a particular size workpiece being located,
  (ii) a support base slideably mounted on the second linear slide mechanism, a support post adapted to be mounted and positioned upon the support base in one of at least two gross adjustment positions, wherein the second multiple position locator jaw is further mounted and positioned on the support post in one of the at least two locator jaw engagement surface positions, the at least two locator jaw engagement surface positions corresponding to normal adjustment positions within a gross adjustment, and pivotal means disposed for pivotal movement about a pivot point and symmetrically coupled between said first locator arm assembly and said second locator arm assembly for inducing an equal but opposite lateral movement in the first and second locator jaws to accurately locate the workpiece on the processing surface between the first and second locator jaws as the locator jaws move towards one another.

2. The apparatus of claim 1, further wherein the at least two gross adjustment positions of said first and second locator arm assemblies each include three different gross adjustment positions on a respective support block, and still further wherein a different gross adjustment position can be selected in increments on the order of 12.5 mm.

3. The apparatus of claim 1, wherein
the at least two locator jaw engagement surface positions of the first and second multiple position locator jaws each correspond to at least two mating engagement surfaces of a single locator jaw, further wherein the mating engagement surfaces include V-shape engagement surfaces.

4. The apparatus of claim 3, further wherein
the V-shape engagement surfaces each include a relief bore at the bottom of the V-shape for receiving a corner of the workpiece therein during a locating of the workpiece.

5. The apparatus of claim 1, wherein each of said first and second multiple position locator jaws include a locator jaw having different engagement surfaces disposed about the outer perimeter thereof, wherein the locator jaw can be rotated for selecting a desired engagement surface for use with a particular sized workpiece.

6. The apparatus of claim 5, further wherein each of said first and second multiple position locator jaws include a locator jaw having four different engagement surfaces disposed at about the outer perimeter thereof, wherein the locator jaw can be rotated at 90, 180, 270, and 360 degrees for selecting a desired engagement surface for use with a particular sized workpiece.

7. The apparatus of claim 6, still further wherein a rotation at 90, 180, 270, and 360 degrees selects a different engagement surface in 5 mm increments.

8. The apparatus of claim 1, further comprising:
means for disposing one of said first locator arm assembly, said second locator arm assembly, and said pivotal means between a first position and a second position, thereby effecting a movement of the first locator jaw and the second locator jaw between an open position and a closed position, respectively.

9. The apparatus of claim 8, wherein said disposing means includes a tension spring for biasing one of said first locator arm assembly, said second locator arm assembly, and said pivotal means in a manner for causing the first locator jaw and the second locator jaw to be displaced towards one another in a closed position in an absence of other outside biasing forces.

10. An apparatus for locating a workpiece on a processing surface, said apparatus comprising:

first locator arm assembly having a first multiple position locator jaw disposed for lateral movement and mating engagement with a first portion of the workpiece, said first locator arm assembly including a first linear slide mechanism having a support base slideably mounted thereon, a support post mounted upon the support base, and the first multiple position locator jaw mounted on the support post, the first multiple position locator jaw adapted for being positioned between one of at least two locator jaw engagement surface positions, wherein each of the locator jaw engagement surface positions is unique to a particular size workpiece being located; and second locator arm assembly having a second multiple position locator jaw disposed for lateral movement parallel to the first multiple position locator jaw and further for mating engagement with a second, opposite side, portion of the workpiece, said second locator arm assembly including a second linear slide mechanism having a support base slideably mounted thereon, a support post mounted upon the support base, and the second multiple position locator jaw mounted on the support post, the second multiple position locator jaw adapted for being positioned between one of at least two locator jaw engagement surface positions, wherein each of the locator jaw engagement surface positions is unique to a particular size workpiece being located, and pivotal means disposed for pivotal movement about a pivot point and symmetrically coupled between said first locator arm assembly and said second locator arm assembly for inducing an equal but opposite lateral movement in the first and second locator jaws to accurately locate the workpiece on the processing surface between the first and second locator jaws as the locator jaws move towards one another.

11. An apparatus for locating a workpiece on a processing surface, said apparatus comprising:

first locator arm assembly having a first multiple position locator jaw disposed for lateral movement and mating engagement with a first portion of the workpiece;

second locator arm assembly having a second multiple position locator jaw disposed for lateral movement parallel to the first multiple position locator jaw and further for mating engagement with a second, opposite side, portion of the workpiece;

pivotal means disposed for pivotal movement about a pivot point and symmetrically coupled between said first locator arm assembly and said second locator arm assembly for inducing an equal but opposite lateral movement in the first and second locator jaws to accurately locate the workpiece on the processing surface between the first and second locator jaws as the locator jaws move towards one another;

a base plate, wherein said first locator arm assembly, said second locator arm assembly, and said pivot means are disposed upon said base plate;

means for moving said base plate between a workpiece load position and a workpiece processing position; and means for infinitely adjusting, between a first fine adjustment stop position and a second fine adjustment stop position, an opening of the locator jaws of said first and second locator arm assemblies when said base plate is in the load position, thereby enabling the first and second multiple position locator jaws to be opened by a desired finely adjusted amount in preparation for an insertion of a workpiece between the first and second multiple position locator jaws.

12. An apparatus for locating a workpiece on a processing surface, said apparatus comprising:

first locator arm assembly having a first multiple position locator jaw disposed for lateral movement and mating engagement with a first portion of the workpiece;

second locator arm assembly having a second multiple position locator jaw disposed for lateral movement parallel to the first multiple position locator jaw and further for mating engagement with a second, opposite side, portion of the workpiece; and pivotal means disposed for pivotal movement about a pivot point and symmetrically coupled between said first locator arm assembly and said second locator arm assembly for inducing an equal but opposite lateral movement in the first and second locator jaws to accurately locate the workpiece on the processing surface between the first and second locator jaws as the locator jaws move towards one another, said pivotal means including a pivotal arm member symmetrically coupled between said first locator arm assembly and said second locator arm assembly using flat springs solidly located between opposite ends of the pivotal arm member and corresponding first and second locator arm assemblies, respectively.

13. The apparatus of claim 11, wherein said infinitely adjusting means includes a vernier mechanism for adjusting an opening of the first and second multiple position locator jaws by an amount on the order of less than 5 mm when said base plate is in the workpiece load position.

* * * * *